United States Patent
Ito et al.

(10) Patent No.: US 9,666,829 B2
(45) Date of Patent: May 30, 2017

(54) ORGANIC ELECTROLUMINESCENT DISPLAY DEVICE

(71) Applicant: Japan Display Inc., Tokyo (JP)

(72) Inventors: Ryoichi Ito, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 85 days.

(21) Appl. No.: 14/477,033

(22) Filed: Sep. 4, 2014

(65) Prior Publication Data

US 2015/0060832 A1    Mar. 5, 2015

(30) Foreign Application Priority Data

Sep. 5, 2013    (JP) .................................. 2013-184287

(51) Int. Cl.
*H01L 51/52* (2006.01)
*H01L 27/32* (2006.01)

(52) U.S. Cl.
CPC ...... *H01L 51/5209* (2013.01); *H01L 27/3246* (2013.01); *H01L 27/3258* (2013.01); *H01L 51/5225* (2013.01); *H01L 51/5271* (2013.01); *H01L 27/322* (2013.01); *H01L 51/5284* (2013.01)

(58) Field of Classification Search
CPC .................................................. H01L 27/3246
See application file for complete search history.

(56) References Cited

U.S. PATENT DOCUMENTS

| | | | |
|---|---|---|---|
| 2012/0175603 A1* | 7/2012 | Takeuchi | ............ H01L 27/3258 257/40 |
| 2013/0168653 A1* | 7/2013 | Nam | ................... H01L 51/5203 257/40 |

FOREIGN PATENT DOCUMENTS

| | | |
|---|---|---|
| JP | 2001-291588 A | 10/2001 |
| JP | 2003-229283 A | 8/2003 |

* cited by examiner

*Primary Examiner* — Jamie C Niesz
(74) *Attorney, Agent, or Firm* — Typha IP LLC

(57) ABSTRACT

An organic electroluminescent display device includes a first insulating layer that buries a peripheral portion of a first electrode and has an opening exposing an area of the first electrode inner to the peripheral portion thereof; a second electrode that is in contact with the first electrode in the opening and is provided continuously on a top surface of the first electrode and onto a top surface of the first insulating layer; a second insulating layer covering a peripheral portion of the second electrode; an organic EL layer; and a third electrode. The second electrode includes a stepped portion. An area where the stepped portion is included and the second electrode, the organic electroluminescence layer and the third electrode overlap each other is a light emitting area. Light emitted by the organic EL layer is reflected by the stepped portion.

4 Claims, 11 Drawing Sheets

ORGANIC ELECTROLUMINESCENT DISPLAY DEVICE

CROSS REFERENCE TO RELATED APPLICATIONS

This application is based upon and claims the benefit of priority from the prior Japanese Patent Application No. 2013-184287, filed on Sep. 5, 2013, the entire contents of which are incorporated herein by reference.

FIELD

The present invention relates to an organic electroluminescent display device, for example, a pixel structure of the organic electroluminescent display device.

BACKGROUND

An organic electroluminescence device (hereinafter, referred to also as an "organic EL device") using an organic electroluminescence material can emit light of various colors in a visible light range in addition to white light when using an appropriate organic material or an appropriate structure. Therefore, display devices and illumination devices using an organic electroluminescence device are being progressively developed.

An organic electroluminescent display device includes an organic EL device in each of pixels. The organic EL device in each pixel is connected to a transistor, and light emission is controlled via the transistor. The organic EL device is formed over a device substrate having the transistor formed thereon. In a typical pixel structure, an interlayer insulating layer is provided between the organic EL device and the transistor. One of electrodes included in the organic EL device and a source electrode or a drain electrode of the transistor are electrically connected to each other in a contact hole formed in the interlayer insulating layer.

An organic electroluminescent display device includes a pixel array including a plurality of such pixels arrayed in a matrix. Light emitted by the organic EL device is emitted toward the device substrate or a counter substrate facing the device substrate, and thus a display screen is formed over a surface of the device substrate or the counter substrate.

The organic EL device includes a layer containing an organic electroluminescence material (hereinafter, referred to as an "organic electroluminescence layer" or an "organic EL layer") between a pair of electrodes, which are also referred to as a positive electrode and a negative electrode. Light emitted by the organic EL layer expands at all the angles of $4\pi$ as represented by solid angle. Therefore, how to effectively use the light output in a direction other than toward the display screen is an issue of studies.

There is a problem that the light emitted and propagated parallel to a film surface of the organic EL layer is emitted toward an end surface of the organic EL layer and is not emitted from a transparent electrode side. A reason for this is that the material forming the organic EL layer has a high refractive index ($n=1.8$ to $1.9$), and thus light incident on an interface between layers having different refractive indices at a specific angle of incidence is totally reflected. For example, light totally reflected at an interface between the organic EL layer and the transparent electrode or an interface between a glass substrate and air is guided in the organic EL layer or the glass substrate and is absorbed in the layer or is emitted from an end surface of the glass substrate. Light guided in the organic EL layer or the glass substrate in this manner is referred to as "waveguide light".

Due to the light guided in the organic EL layer, the extraction efficiency of the light generated in the organic EL layer (ratio of the light emitted toward the glass substrate with respect to the total amount of light emitted by the organic EL layer) is considered as being about 20%. Increasing the extraction efficiency of the light generated in the organic EL layer is important to reduce the power consumption of the organic electroluminescent display device using the organic EL device.

Light that is emitted obliquely with respect to a surface of the pixel including the organic EL device is leakage light. The leakage light emitted from an adjacent pixel and causes a problem of color mixture. Therefore, usually, a light shielding layer is provided to partition the areas of adjacent pixels so that light emitted from one pixel is prevented from being mixed with light emitted from a pixel adjacent thereto. However, when the width of the light shielding layer is increased in order to reduce the influence of color mixture, a problem occurs that the numerical aperture of the pixels is decreased and the light emitted by the organic EL layer is not efficiently used.

In an organic electroluminescent display device disclosed in Japanese Laid-Open Patent Publication No. 2001-291588, an organic EL layer is formed even in a contact hole in which an electrode connected to a transistor and a pixel electrode are connected to each other, and an interlayer insulating layer is formed of a light-transmissive insulating material such as polyimide, polyamide, acrylic resin or the like. A side wall of the contact hole includes a steeply inclining surface. In such a part of the organic electroluminescent display device, usual light emitting luminance is not obtained, and in addition, the light emitted from pixels cannot be effectively used. The above-identified publication also discloses a structure in which the contact hole is buried with an organic resin so that an organic EL layer is not formed in this part.

An organic electroluminescent display device disclosed in Japanese Laid-Open Patent Publication No. 2003-229283 discloses a structure in which a peripheral portion of a pixel electrode is covered with a partition film (insulating film). The pixel electrode is connected to lines in an underlying layer provided below the pixel electrode through a contact hole formed in an insulating layer also formed below the pixel electrode. The partition film is provided over the contact hole and covering the same.

According to the conventional technologies, an organic EL device including an organic EL layer is mainly formed over a flat area. Therefore, as described above, light propagated in the organic EL layer in a horizontal direction (namely, waveguide light) cannot be used. In other words, no measure is taken to effectively use the light staying in the organic EL layer.

SUMMARY

An organic electroluminescent display device according to one embodiment of the present invention includes a first electrode connecting to a light emitting control device; a first insulating layer covering a peripheral portion of the first electrode and having an opening exposing an area of inner side of the peripheral portion of the first electrode; a second electrode contacting the first electrode in the opening of the first insulating layer and extending from the upper surface of the first electrode to the upper surface of the first insulating layer; a second insulating covering a peripheral portion of the second electrode; an organic electroluminescence layer extending from a top surface of the second electrode to a top surface of the second insulating layer; a third electrode over the organic electroluminescence layer. The second electrode including a stepped portion between the first electrode and the first insulating layer, and an overlapping area of the second electrode, the organic electroluminescence layer and the third electrode each other is a light emitting area, the light emitting area is including the stepped portion.

An organic electroluminescent display device according to one embodiment of the present invention includes a first electrode connecting to a light emitting control device; a first insulating layer covering a peripheral portion of the first electrode and having an opening exposing an area of inner side of the peripheral portion of the first electrode; a second electrode contacting the first electrode in the opening of the first insulating layer and extending from the upper surface of the first electrode to the upper surface of the first insulating layer; a second insulating layer covering a peripheral portion of the second electrode; a third insulating layer covering a peripheral portion edge portion of the opening of the first insulating layer; an organic electroluminescence layer extending from a top surface of the second electrode and to a top over a surface of the second insulating layer and the third insulating layer; and a third electrode over the organic electroluminescence layer. An overlapping area of the second electrode, the organic electroluminescence layer and the third electrode each other at the opening of the third insulating layer is a light emitting area.

An organic electroluminescent display device according to one embodiment of the present invention includes a first electrode connecting to a light emitting control device; a first insulating layer having an opening which exposes the first electrode and has an edge portion in an area outer to the first electrode; a second electrode contacting the first electrode, and extending from the upper surface of the first electrode to the edge portion of the opening of the first insulating layer; a second insulating layer covering a peripheral portion of the second electrode; an organic electroluminescence layer extending from a top surface of the second electrode and to a top surface of the second insulating layer; and a third electrode over the organic electroluminescence layer. The second electrode includes a stepped portion at least at the edge portion of the opening of the first insulating layer; the edge portion and an overlapping area of the second electrode, the organic electroluminescence layer and the third electrode each other is a light emitting area.

An organic electroluminescent display device according to one embodiment of the present invention includes a first electrode connecting to a light emitting control device; a first insulating layer which has a first opening and a second opening and covers a peripheral portion of the first electrode, the first opening exposing an area of inner side of the peripheral portion of the first electrode, and an edge portion of the second opening arranged an area of outer side of the first electrode; a second electrode contacting first electrode in the first opening of the first insulating layer and from the upper surface of the first electrode to the upper surface of the first insulating layer; a second insulating layer covering a peripheral portion of the second electrode; an organic electroluminescence layer extending from a top surface of the second electrode and to a top surface of the second insulating layer; and a third electrode over the organic electroluminescence layer. The second electrode includes a first stepped portion at an edge portion of the first opening of the first insulating layer and a second stepped portion at the edge portion of the second opening; and an overlapping area of the second electrode, the organic electroluminescence layer and the third electrode each other is a light emitting area, and the light emitting area including the first stepped portion and the second stepped portion.

An organic electroluminescent display device according to one embodiment of the present invention includes a first electrode connecting to a light emitting control device; a first insulating layer which has a first opening and a second opening and covers a peripheral portion of the first electrode and the first opening exposing an area of inner side of the peripheral portion of the first electrode; a second electrode contacting the first electrode in the first opening of the first insulating layer and extending from the upper surface of the first electrode to the upper surface of the first insulating layer; a second insulating layer covering a peripheral portion of the second electrode and the edge portion of the second opening of the first insulating layer; an organic electroluminescence layer extending from a top surface of the second electrode and to a top surface of the second insulating layer; and a third electrode over the organic electroluminescence layer. The second electrode includes a first stepped portion at an edge portion of the first opening and a second stepped portion at an edge portion of the second opening of the first insulating layer, the second stepped portion is covered by the second insulating layer; and an overlapping area of the first stepped portion, the second electrode, the organic electroluminescence layer and the third electrode each other is a light emitting area.

In another embodiment of the organic electroluminescent display device according to one embodiment of the present invention, it is preferable that the second electrode has a light-reflecting surface, and that the light-reflecting surface is curved at the stepped portion. Even in the case where the second electrode has a plurality of stepped portions, it is preferable that the light-reflecting surface is curved at each of the stepped portions. The second electrode is curved and such a curved part acts at least as a light-reflecting surface. Owing to this, light emitted parallel to a film surface of the organic electroluminescence layer and light emitted obliquely from the organic electroluminescence layer can be reflected by the light-reflecting surface(s) to become emitted light from the pixel.

In still another embodiment of the organic electroluminescent display device according to one embodiment of the present invention, it is preferable that the stepped portion of the second electrode includes an inclining surface. Since the stepped portion includes an inclining surface, light emitted parallel to a film surface of the organic electroluminescence layer and light emitted obliquely from the organic electroluminescence layer can be reflected in a direction in which the light is to be emitted from a pixel.

In still another embodiment of the organic electroluminescent display device according to one embodiment of the present invention, in the case where the second electrode has a plurality of stepped portions and the stepped portions each include an inclining surface, it is preferable that the inclining surfaces are inclined at different inclination angles. Since the inclination angles of the inclining surfaces at the plurality of stepped portions are different, light emitted obliquely from the organic electroluminescence layer can be reflected in a direction in which the light is to be emitted from a pixel. The direction in which light reflected by one of the inclining surfaces is emitted can be made different from the direction in which light reflected by another of the inclining surfaces is output.

DESCRIPTION OF EMBODIMENTS

Hereinafter, embodiments of the present invention will be described with reference to the drawings or the like. The present invention can be carried out in many different embodiments, and is not to be interpreted as being limited to any of the following embodiments.

In the following description of the present invention, elements having the same or similar functions will bear identical reference signs in different figures. For such elements, the same description will not be repeated unless there is a specific reason. In the present specification, in the case where certain components or areas are present "over" or "under" and "above" or "below" other components or areas, as long as there are no particular limitations, this includes not only the case where components or areas are directly above or directly below other components or areas but also the case where components or areas are above or below other components or areas with other structural components provided in between.

Embodiment 1

Figure 1:
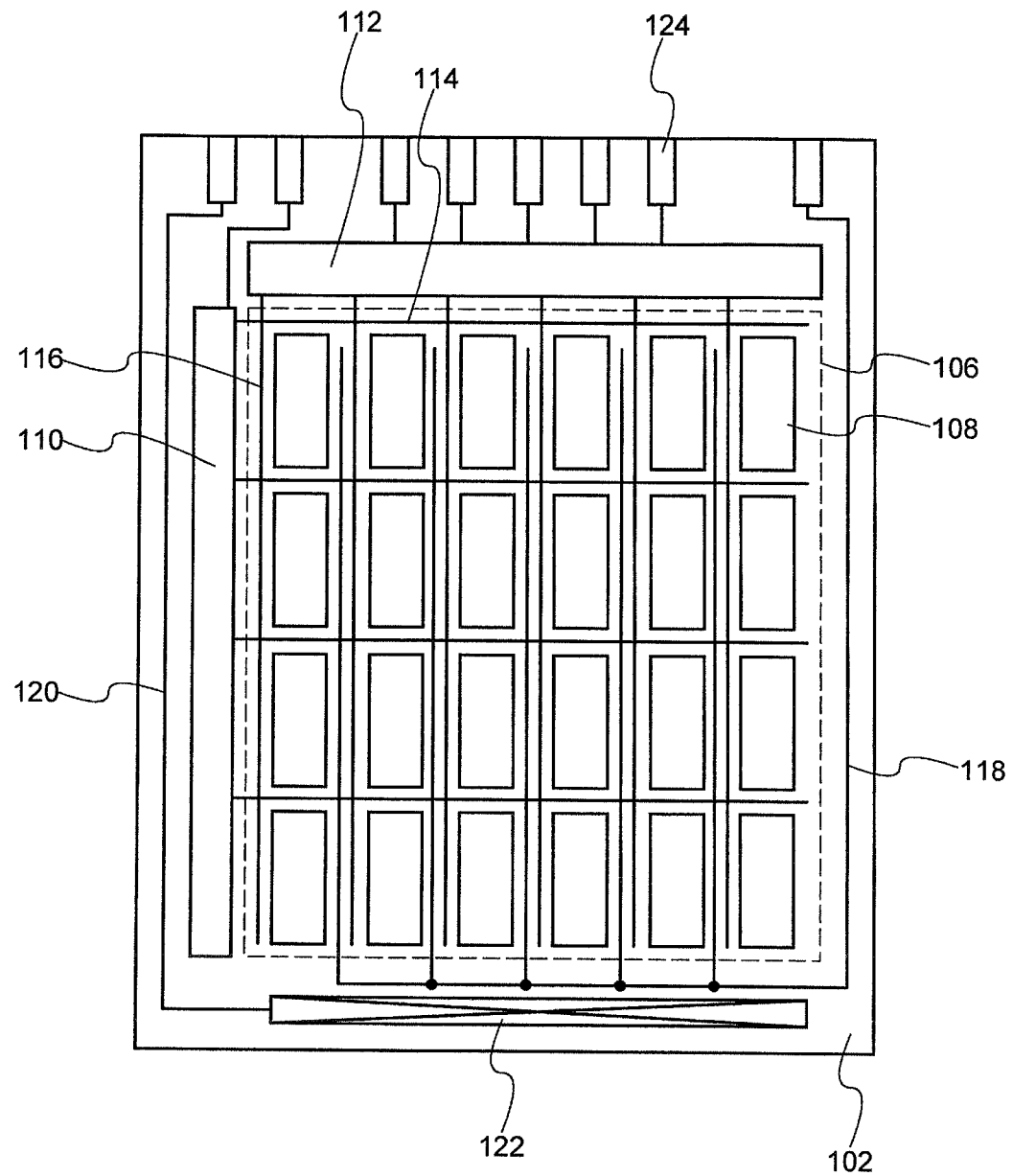
FIG. 1 shows a structure of an organic electroluminescent display device according to one embodiment of the present invention.

FIG. 1 shows a structure of an organic electroluminescent display device according to this embodiment. The organic electroluminescent display device includes a device substrate 102, a pixel area 106 in which pixels 108 are arrayed in a matrix, a gate signal line driving circuit 110, and a data signal line driving circuit 112. The pixel area 106, the gate signal line driving circuit 110 and the data signal line driving circuit 112 are provided over the device substrate 102.

A signal that is output from the gate signal line driving circuit 110 is supplied to gate signal lines 114, and a signal that is output from the data signal line driving circuit 112 is supplied to data signal lines 116. The gate signal lines 114 and the data signal lines 116 are provided so as to intersect each other in the pixel area 106, and respectively supply a signal to the pixels 108 arrayed in a matrix. An organic EL device is provided in each of the pixels 108, and a light emission state of the organic EL device is controlled by a light emitting control device. Transistor is applied as an embodiment of the light emitting control device. Field effect transistor is preferably as a transistor. For example, field-effect transistor may also be called a thin film transistor.

In the pixel area 106, a power supply line 118 used to supply an electric current to the organic EL devices and a common line 120 used to supply a common potential to one of electrodes of the organic EL device in each pixel 108 are provided. The common line 120 is connected to the one electrode of the organic EL device at a common contact 122 that is provided in the pixel area 106 or in the vicinity thereof. Input terminals 124 provided in an end portion of the device substrate 102 include a plurality of terminals to which signals to be supplied to the gate signal line driving circuit 110 and the data signal line driving circuit 112 are input, and also include a power supply input terminal connected to the power supply line 118, a common input terminal that supplies the common potential to the common line 120, and the like.

In the organic electroluminescent display device shown in FIG. 1, organic EL devices that emit light of a single color may be provided in the pixels 108 so that monochromatic display is provided. Alternatively, organic EL devices that emit light of red (R), green (G) and blue (B) may be provided in the pixels 108, or such organic EL devices may be provided in the pixels 108 and also pixels 108 which emit white (W) light may be provided. In these cases, color display is provided.

Figure 11:
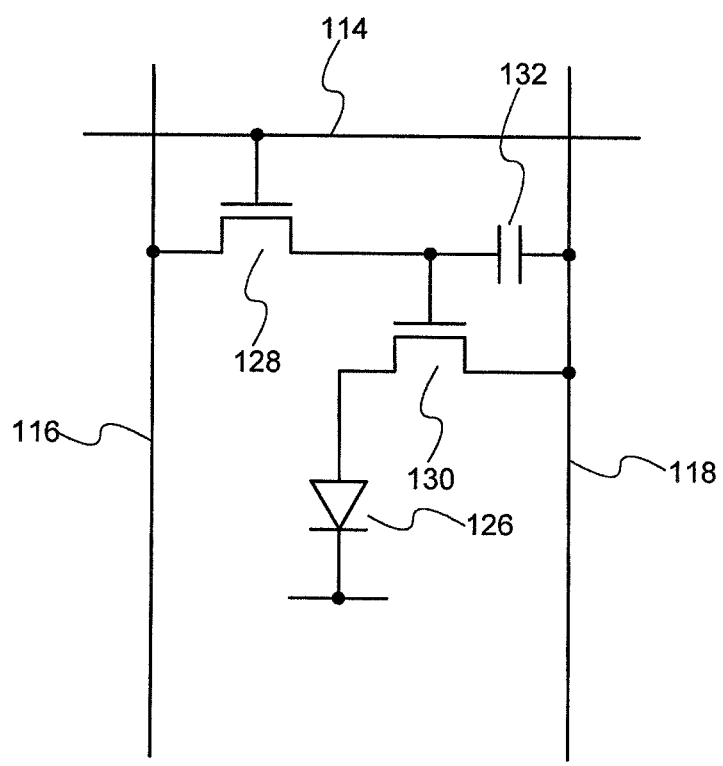
FIG. 11 shows an equivalent circuit of a pixel.

FIG. 11 shows an example of circuit configuration of the pixel 108. When a selection signal is supplied to the gate signal line 114, a selection transistor 128 supplies a data signal from the data signal line 116 as a gate potential of a driving transistor 130 in synchronization with the selection signal. A capacitor 132 keeps the gate potential. The driving transistor 130 connected to the power supply line 118 supplies a drain current based on the gate potential to an organic EL device 126. The organic EL device 126 emits light at a luminance based on the drain current. In the organic electroluminescent display device, the EL display device 126 is driven by a plurality of transistors provided for each pixel.

Figure 2:
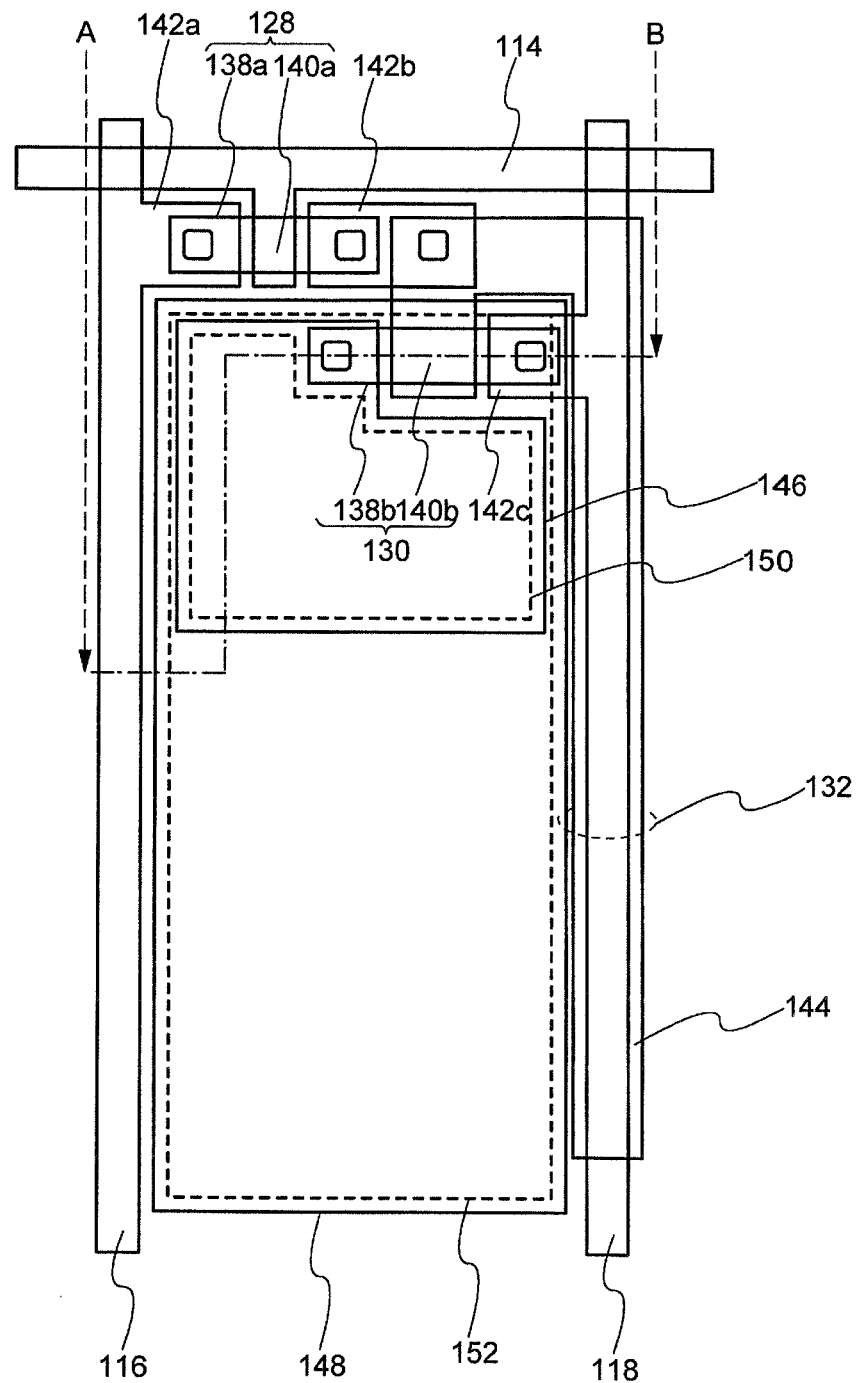
FIG. 2 is a plan view showing a pixel structure of the organic electroluminescent display device according to one embodiment of the present invention.

FIG. 2 is a plan view showing an example of the pixel 108 including various elements based on the pixel circuit shown in FIG. 11. The pixel 108 includes the selection transistor 128, the driving transistor 130 and the capacitor 132. The selection transistor 128 includes a gate electrode 140a overlapping a semiconductor layer 138a, and the gate electrode 140a is connected to the gate signal line 114. An electrode 142a, which is one of a source electrode and a drain electrode of the selection transistor 128, is connected to the data signal line 116, and an electrode 142b, which is the other of the source electrode and the drain electrode of the selection transistor 128, is connected to a gate electrode 140b of the driving transistor 130. The driving transistor 130 includes a semiconductor layer 138b overlapping the gate electrode 140b. An electrode 142c, which is one of a source electrode and a drain electrode of the driving transistor 130, is connected to the power supply line 118. A first electrode 146, which is the other of the source electrode and the drain electrode of the driving transistor 130, is connected to the organic EL device. The capacitor 132 is formed of a capacitance electrode 144 formed in the same layer as the gate electrode 140b and the power supply line 118, which overlaps the capacitance electrode 144 in the state where an insulating layer is held between the power supply line 118 and the capacitance electrode 144.

The configuration of the pixel circuit shown in FIG. 11 and the layout of the pixel shown in FIG. 2 are each an example, and the organic electroluminescent display device according to the present invention is not limited to such a pixel circuit configuration or such a pixel structure. For example, the organic electroluminescent display device according to the present invention may further include a circuit that compensates for a threshold voltage of the driving transistor 130 or a switching transistor that forcibly terminates light emission of the organic EL device 126.

At least a peripheral portion of the first electrode 146 in the pixel 108 is covered with a first insulating layer 150. An inner area of the first electrode 146 that is not covered with the first insulating layer 150 is in contact with a second electrode 148. Namely, the first electrode 146 and the second electrode 148 are electrically connected to each other via an opening (contact hole) provided in the first insulating layer 150.

In this embodiment, the pixel electrode includes the first electrode 146 and the second electrode 148. The first electrode 146 and the second electrode 148 are electrically connected to each other, and thus may be described as an integral element. However, herein, the first electrode 146 and the second electrode 148 will be described as a plurality of conductive layers because of the structure thereof.

Figure 3:
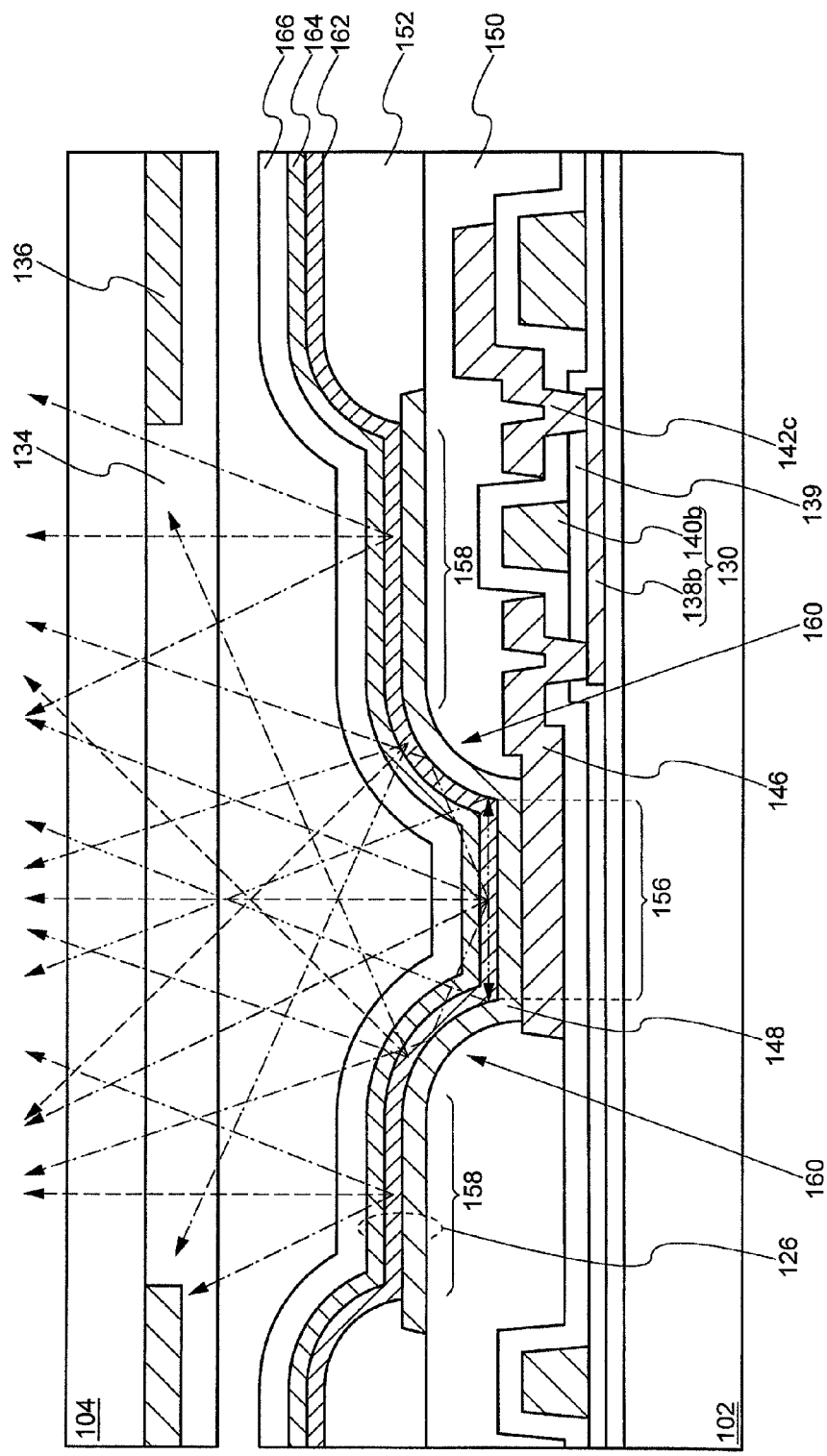
FIG. 3 is a cross-sectional view showing the pixel structure of the organic electroluminescent display device according to one embodiment of the present invention.

FIG. 3 is a vertical cross-sectional view of the pixel taken along line A-B shown in FIG. 2. FIG. 3 shows the positional relationship between the device substrate 102 on which the driving transistor 130, the organic EL device 126 and the like are formed, and a counter substrate 104 facing the device substrate 102. Over the counter substrate 104, a color filter 134 and a light shielding layer 136 are provided.

The first electrode 146 is located so as to overlap the second electrode 148. The opening of the first insulating layer 150 is formed to be large in an inner area except for an area covering the peripheral portion of the first electrode 146. It is preferable that a side wall of the opening of the first insulating layer 150 is inclining. It is preferable that the side wall of the opening includes an inclining surface that inclines from a bottom portion in contact with the first electrode 146 so as to open toward a top planar surface of the first insulating layer 150.

The first insulating layer 150 is preferably formed of an inorganic insulating material such as silicon oxide, silicon nitride or the like; or an organic insulating material such as an acrylic resin, a polyimide resin or the like. The first insulating layer 150 including the above-described inclining surface in the side wall can be formed by use of taper etching. In the case where a photosensitive organic resin material is used for the first insulating layer 150, the side wall of the opening of the first insulating layer 150 can be formed to include the above-described inclining surface by appropriately adjusting the exposure time or the development conditions.

The second electrode 148 extends on a top planar surface of the first electrode 146, over the side wall of the opening of the first insulating layer 150 (inclining surface) and onto the top planar surface of the first insulating layer 150. In other words, the second electrode 148 includes a first planar area 156 on the first electrode 146, a second planar area 158 on the first insulating layer 150 and a stepped portion 160 over the side wall of the opening of the first insulating layer 150.

A peripheral portion of the second electrode 148 is covered with a second insulating layer 152. In other words, the second insulating layer 152 has an opening in which the second electrode 148 is provided. It is preferable that a side wall of the opening of the second insulating layer 152 includes an inclining surface like the side wall of the opening of the first insulating layer 150.

Over the second electrode 148, the organic EL layer 162 is provided. The organic EL layer 162 may be formed of either a low molecular organic material or a high molecular organic material. In the case where, for example, a low molecular organic material is used for the organic EL layer 162, the organic EL layer 162 may be formed to include a light emitting layer containing a light-emitting organic material and also, for example, a hole transport layer and an electron transport layer having the light emitting layer held there between.

Over the organic EL layer 162, a third electrode 164 is provided. The peripheral portion of the second electrode 148 is covered with the second insulating layer 152 and the organic EL layer 162 is continuously provided over a top surface of the second electrode 148 and onto a surface of the second insulating layer 152. Therefore, the third electrode 164 is not shorted with the first electrode 146 or the second electrode 148. Over the third electrode 164, a passivation layer 166 is provided. The passivation layer 166 is preferably formed of, for example, an insulating material such as silicon nitride ($Si_3N_4$) or the like.

The organic EL device 126 emits light as follows. A positive electrode (electrode on the side where holes are injected) is provided on one surface of the organic EL layer 162, and a negative electrode (electrode on the side where electrons are injected) is provided over the other surface of the organic EL layer 162. When a predetermined potential difference is supplied between the electrodes, the organic EL device 126 emits light. The positive electrode and the negative electrode may be formed of any of various conductive materials. Usually, the material used for the positive electrode has a higher work function than that of the material used for the negative electrode. In order to allow the emitted light to be output efficiently, it is preferable that one of the electrodes is a reflective electrode whereas the other electrode is a light-transmissive electrode.

In order to allow the organic EL device 126 to act as a top emission type organic EL device, the second electrode 148 may act at least as a positive electrode, or as a positive and reflective electrode. In order to allow the second electrode 148 to be a positive and reflective electrode, the second electrode 148 may be formed of, for example, a metal material such as titanium (Ti), titanium nitride (TiN), platinum (Pt), nickel (Ni), chromium (Cr), tungsten (W) or the like. However, these metal materials have a lower reflectance than that of aluminum (Al) or silver (Ag), and therefore are slightly inferior to aluminum (Al) or silver (Ag) as a material of a reflective electrode. In order to increase the reflectance of a reflective electrode, it is preferable that the second electrode 148 has a multi-layer structure. More specifically, it is preferable that an indium tin oxide (ITO) layer having a high work function is provided in contact with the organic EL layer 162 and a layer that is formed of aluminum (Al) or silver (Ag) and provides a light-reflecting surface is located below the ITO layer.

In order to allow the third electrode 164 to be a negative electrode, the third electrode 164 may be formed of, for example, a material including aluminum (Al) and calcium (Ca) or magnesium (Mg), or a material including aluminum (Al) and an alkaline metal material such as lithium (Li) or the like. In order to allow the third electrode 164 to be a negative and light-transmissive electrode, it is desirable that the above-described metal layer is formed to be sufficiently thin to allow light to be transmitted there through easily, or that a transparent conductive film formed of indium tin oxide (ITO), indium zinc oxide (IZO) or the like is stacked over the metal layer.

In order to allow the second electrode 148 to act as a positive and reflective electrode, the second electrode 148 may be formed of an aluminum (Al)-based or silver (Ag)-based metal material as described above. In order to allow the third electrode 164 to be a negative and light-transmissive electrode, the third electrode 164 may be formed of a transparent conductive film formed of indium tin oxide (ITO), indium zinc oxide (IZO) or the like.

In the case where the second electrode 148 is a reflective electrode and the third electrode 164 is a light-transmissive electrode, the light emitted by the organic EL layer 162 is output through the third electrode 164. However, the light emitted by the organic EL layer 162 is emitted at all the angles of 4π as represented by solid angle. Therefore, with the conventional structure, only a part of the light emitted by the organic EL layer 162 would be output from the third electrode 164.

However, in the organic electroluminescent display device in this embodiment, the second electrode 148 acting as the reflective electrode is not merely provided on one planar surface, but includes the first planar area 156 over the first electrode 146, the second planar area 158 over the first insulating layer 150 and the stepped portion 160 between the first planar area 156 and the second planar area 158. The stepped portion 160 forms a light-reflecting surface inclining with respect to the first planar area 156 or the second planar area 158. Since the stepped portion 160 is included in the pixel, the light guided in the organic EL layer 162 and the light emitted in an oblique direction from the organic EL layer 162 are reflected to become emitted light.

FIG. 3 schematically shows, with the dashed and chain lines, the route of the light that is emitted by the organic EL layer 162 and is emitted in various directions. Among the light emitted by the organic EL layer 162, a vertical light component (light that is emitted generally vertically with respect to a film surface of the organic EL layer) 162 is emitted outside through the third electrode 164. FIG. 3 (and also the other figures) schematically shows such a vertical light component with the arrowed dashed lines. The light that is emitted toward the second electrode 148 is reflected by the light-reflecting surface of the second electrode 148, and a vertical component of the reflected light is considered to be emitted outside.

By contrast, among the light emitted by the organic EL layer 162, a parallel light component (light that is emitted generally parallel to the film surface of the organic EL layer 162, and light totally reflected at the interface between the organic EL layer 162 and the second electrode 148 or the third electrode 164) would be lost without being output outside through the third electrode 164 with the conventional structure. However, according to the pixel structure in this embodiment, there is the stepped portion 160. At least the parallel light component that is emitted in an area corresponding to the first planar area 156 is reflected by the stepped portion 160 and is emitted toward the third electrode 164. FIG. 3 (and also the other figures) schematically shows such a parallel light component with the arrowed two-dot chain lines. Namely, the stepped portion 160 of the second electrode 148 has a function of reflecting the light guided in the organic EL layer 162.

Among the light emitted by the organic EL layer 162, an oblique light component (light that is emitted obliquely with respect to the film surface of the organic EL layer 162) could be emitted toward an adjacent pixel to cause color mixture. However, in this embodiment, such an oblique light component is reflected by the stepped portion 160 and is emitted toward the third electrode 164. Namely, the stepped portion 160 of the second electrode 148 reflects a part of such an oblique light component from the organic EL layer 162. FIG. 3 (and also the other figures) schematically shows such an oblique light component with the arrowed one-dot chain lines.

In order to extract the light outside efficiently, the inclination angle of the stepped portion 160 may be 30 to 60 degrees, preferably around 45 degrees. The stepped portion 160 is not limited to including a straight inclining surface. As shown in FIG. 3 as an example, the inclining surface may have a continuously changing inclination angle like a quadratic curve as seen in a cross-sectional view.

The stepped portion 160 of the second electrode 148 can be formed by roughening the surface of the first insulating layer 150, which is an underlying layer of the second electrode 148, in accordance with the position at which the second electrode 148 is to be provided. Preferably, the opening is formed so as to expose the surface of the first electrode 146, which would be otherwise buried by the first insulating layer 150. In this manner, the stepped portion 160 can be formed by merely changing the electrode pattern, without significantly changing the production process. In the case where the insulating material used to form the first insulating layer 150 and the metal material used to form the first electrode 146 are selectively processed in the etching step, the selection ratio of etching is relatively high. Therefore, the etching itself is not much difficult. In addition, since the opening of the first insulating layer 150 also acts as a contact hole, the number of etching steps is not increased.

Namely, it is considered that in the pixel structure shown in FIG. 2 and FIG. 3, the contact hole that connects the pixel electrode and the lines provided in the layer below the pixel electrode is expanded to a certain area in the pixel electrode. In addition, a bottom surface of the contact hole is flat, and thus this area is also usable as an effective light emitting area. The inclining surface of the stepped portion 160 of the contact hole is inclining gently, and thus a light emitting area can be continuously formed over the first planar area 156, over the stepped portion 160 and onto the second planar area 158 of the second electrode 148.

As described above, among the light emitted by the organic EL layer 162, the parallel light component is reflected by the light-reflecting surface provided by the stepped portion 160 of the second electrode 148 and is emitted toward the third electrode 164. As a result, the extraction efficiency of the light generated by the organic EL layer 162 can be increased. Provision of such a light-reflecting surface in the plane of the pixel can further increase the extraction efficiency of the light generated by the organic EL layer 162.

In FIG. 3, the driving transistor 130 has an insulating gate structure, namely, includes a gate insulating layer 139 between the semiconductor layer 138 and the gate electrode 140b. The thin film transistor shown in FIG. 3, namely, the driving transistor 130 has a top gate structure. The thin film transistor is not limited to having the top gate structure. A bottom gate structure, for example, may be used in the organic electroluminescent display device in this embodiment in substantially the same manner.

In the organic electroluminescent display device in this embodiment, the stepped portion 160 of the second electrode 148 acts as a light-reflecting surface. The light that is emitted parallel to the film surface of the organic electroluminescence layer 162 and the light that is emitted obliquely from the organic electroluminescence layer 162 are reflected by the light-reflecting surface to become emitted light from the pixel.

According to this embodiment, the pixel electrode includes the stepped portion 160, and thus the light emitted by the organic EL layer 162 can be effectively extracted as emitted light from the pixel, and also the light extraction efficiency from the pixel can be increased. In other words, the contact hole 160 of the pixel electrode is enlarged so that the bottom surface of the contact hole acts as a light emitting surface in addition to the top surface of the pixel electrode, and the side wall of the contact hole 160 acts as a light-reflecting surface. As a result, the light emitted by the organic EL layer 162 can be effectively extracted in a direction in which the light is to be emitted.

Embodiment 2

Figure 4:
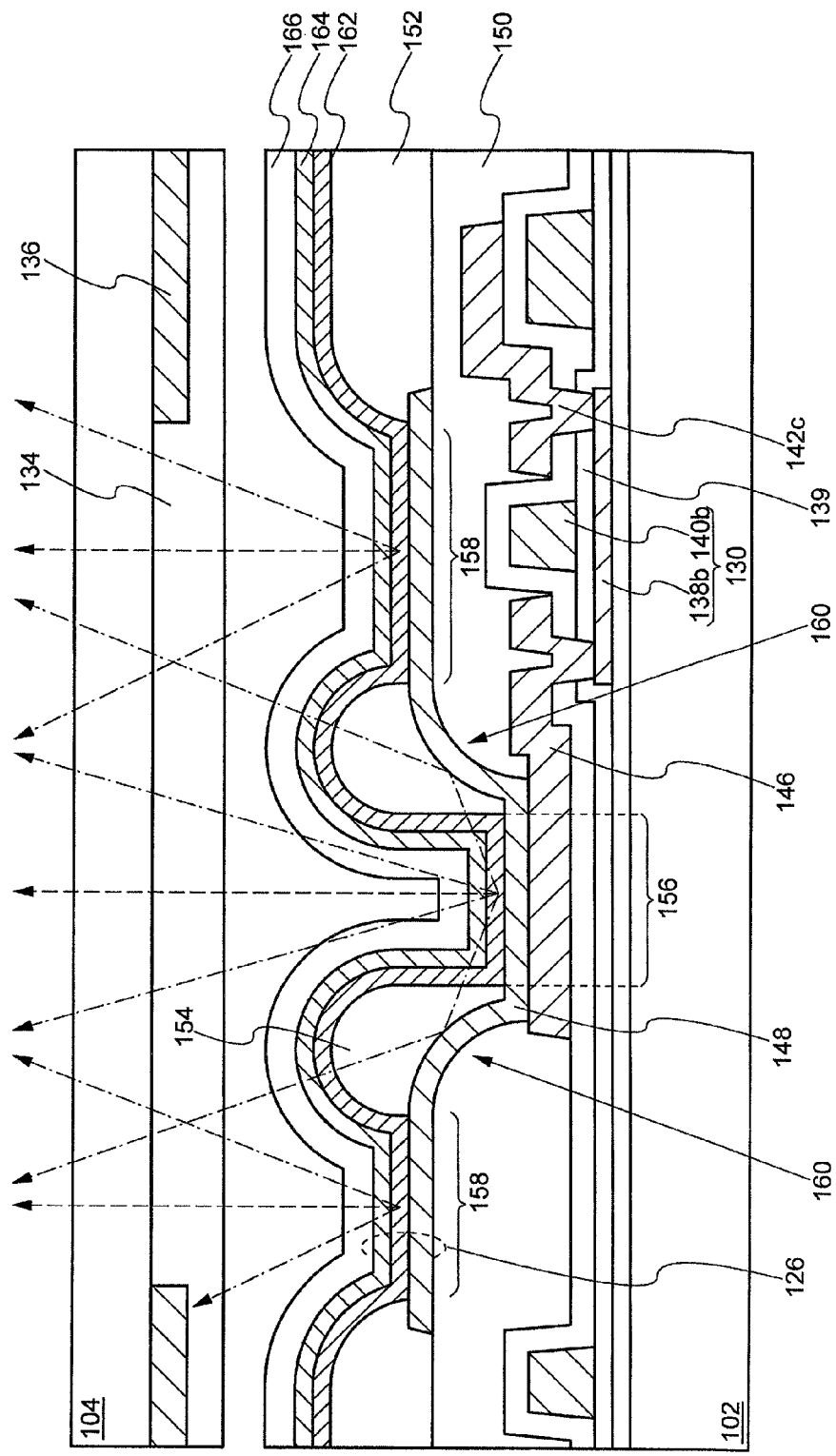
FIG. 4 is a cross-sectional view showing a pixel structure of an organic electroluminescent display device according to one embodiment of the present invention.

With reference to FIG. 4, a pixel structure of an organic electroluminescent display device in this embodiment will be described. In this embodiment, the first electrode 146, the second electrode 148, the first insulating layer 150 and the second insulating layer 152 have the same structure as that in Embodiment 1.

As shown in FIG. 4, a third insulating layer 154 is provided so as to overlap the stepped portion 160 of the second electrode 148. The organic EL layer 162 and the third electrode 164 are provided over the second electrode 148 except for the stepped portion 160. At the stepped portion 160, the organic EL layer 162 and the third electrode 164 are provided over a top surface of the third insulating layer 154. Namely, at least the organic EL layer 162 is out of contact from the second electrode 148 at the stepped portion 160. Therefore, an area of the organic EL layer 162 that is over the third insulating layer 154 is a non-light emitting area where no light is emitted.

In the case where the organic EL layer 162 is formed over the first planar area 156, over the stepped portion 160 and onto the second planar area 158, the direction in which the light in the stepped portion 160 is emitted is different from the direction in which the light in the planar areas 156 and 158 is emitted. In the case where, for example, the first planar area 156 and the second planar area 158 occupy most of the second electrode 148, the vertical light component in the stepped portion 160 is equivalent to the oblique light component in the planar areas 156 and 158. Namely, where the pixel is seen through in a plan view, the light emitted by the organic EL layer 162 in an area corresponding to the stepped portion 160 may not be effectively used as emitted light from the pixel.

In this embodiment, the organic EL layer 162 does not emit light in an area corresponding to the stepped portion 160. This decreases the amount of the oblique light component. In the case where the third insulating layer 154 is formed of a light-transmissive insulating material, the oblique light component that is emitted from the organic EL layer 162 in an area corresponding to the first planar area 156 (light represented with the arrowed one-dot chain lines in FIG. 4) is reflected by the stepped portion 160 acting as a light-reflecting surface as in Embodiment 1. The light reflected by the stepped portion 160 is usable as the emitted light from the pixel. Thus, the light utilization factor is increased. The organic EL layer 162 does not emit light in an area corresponding to the stepped portion 160. Therefore, color mixture between the light emitted from pixels adjacent to each other or pixels close to each other is prevented.

The third insulating layer 154 can be formed in the same step as the second insulating layer 152. Therefore, the pixel structure in this embodiment can be produced merely by using a different photomask in the step of forming the second insulating layer 152 as compared with the pixel structure in Embodiment 1, with no addition of production steps.

In the organic electroluminescent display device in this embodiment, the third insulating layer 154 is provided so as to overlap the stepped portion 160 of the second electrode 148, and thus the stepped portion 160 is usable as a light-reflecting surface. The light that is emitted parallel to the film surface of the organic electroluminescence layer 162 and the light that is emitted obliquely from the organic electroluminescence layer 162 are reflected by the light-reflecting surface to become emitted light from the pixel.

According to this embodiment, the organic EL layer 162 does not emit light in an area corresponding to the stepped portion 160 of the second electrode 148. Therefore, the amount of the oblique light component can be decreased. Among the light emitted in an area corresponding to the planar areas 156 and 158, the oblique light component is reflected to become emitted light from the pixel. This can increase the light extraction efficiency from the pixel.

Embodiment 3

Figure 5:
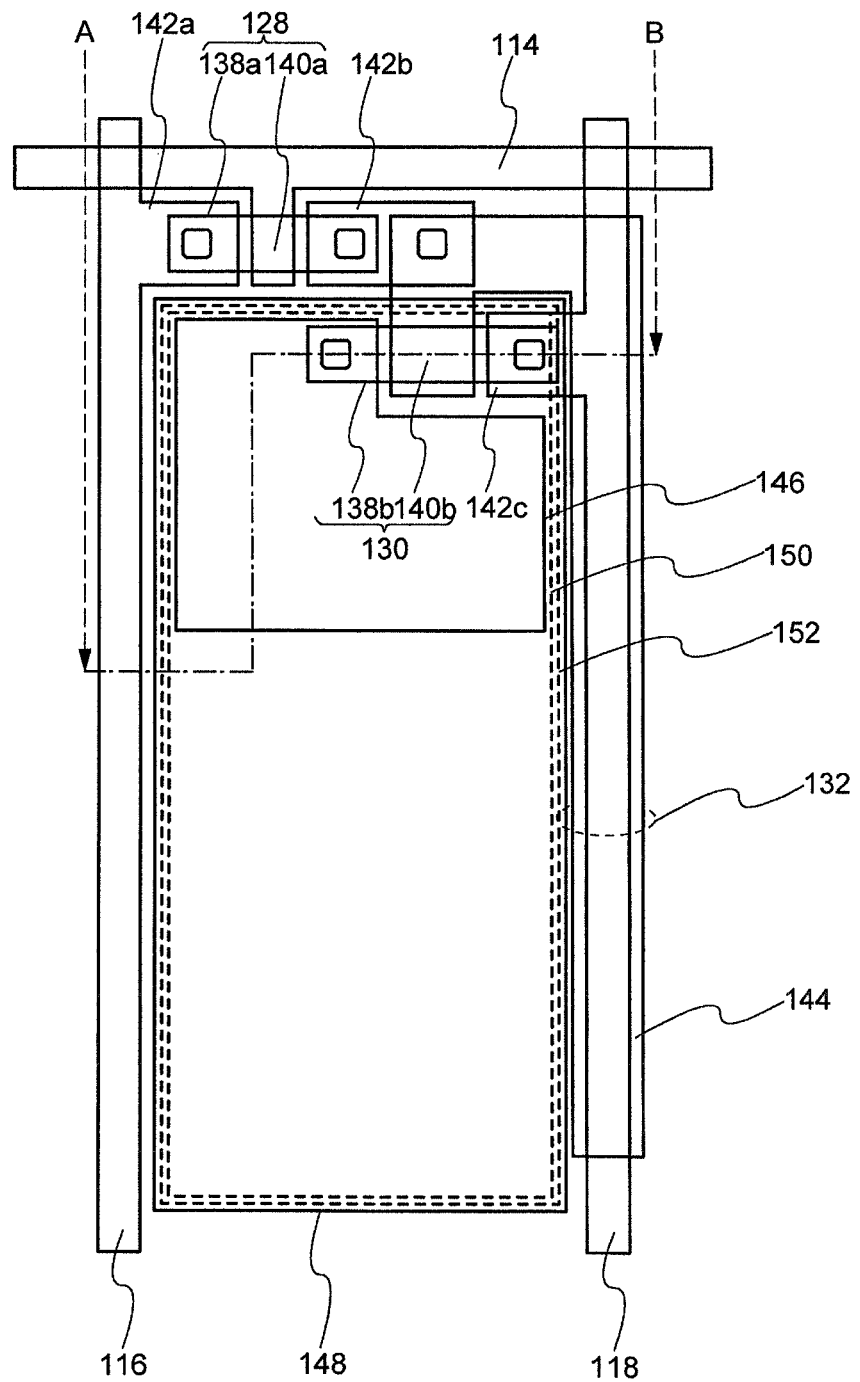
FIG. 5 is a plan view showing a pixel structure of an organic electroluminescent display device according to one embodiment of the present invention.
Figure 6:
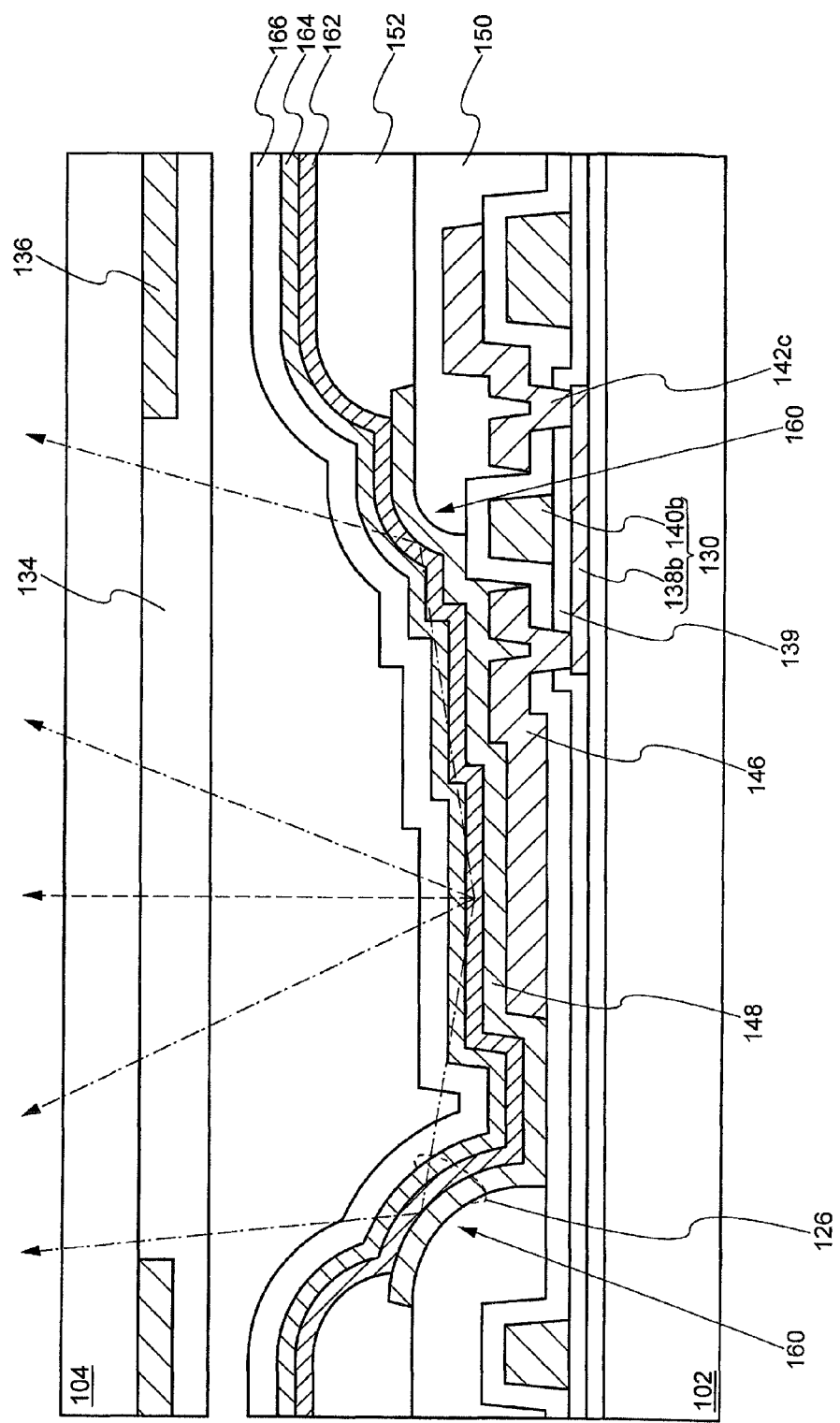
FIG. 6 is a cross-sectional view showing the pixel structure of the organic electroluminescent display device according to one embodiment of the present invention.

With reference to FIG. 5 and FIG. 6, a pixel structure of an organic electroluminescent display device in this embodiment will be described. FIG. 5 is a plan view of a pixel, and FIG. 6 shows a cross-sectional structure of the pixel taken along line A-B in FIG. 5. The following description will be given with reference to FIG. 5 and FIG. 6.

In the pixel in this embodiment, an end of the first insulating layer 150 is in an area outer to the first electrode 146. Namely, an edge portion of the opening of the first insulating layer 150 is in an area outer to the first electrode 146. The second electrode 148 is provided over the first electrode 146, at the edge portion of the opening of the first insulating layer 150 and onto the top surface of the first insulating layer 150. The second insulating layer 152 is provided so as to cover a peripheral portion of the second electrode 148. The organic EL layer 162 and the third electrode 164 are provided over the top surface of the second electrode 148 and onto the surface of the second insulating layer 152.

In such a structure, the stepped portion 160 is provided in a peripheral area of the second electrode 148. Therefore, among the light emitted by the organic EL layer 162 in an inner area of the pixel (inner area of the second electrode 148), the oblique light component (light represented with the arrowed one-dot chain lines in FIG. 6) is reflected by the light-reflecting surface provided by the stepped portion 160.

Such a pixel structure in this embodiment can be produced merely by using a different photomask in the step of forming the opening of the first insulating layer 150 as compared with the pixel structure in any of the above-described embodiments, with no addition of production steps.

In the organic electroluminescent display device in this embodiment, the stepped portion 160 of the second electrode 148 is located in the peripheral area of the second electrode 148. Owing to this structure, a larger amount of the light that is emitted parallel to the film surface of the organic electroluminescence layer and also a larger amount of the light that is emitted obliquely from the organic electroluminescence layer are reflected by the light-reflecting surface to become emitted light from the pixel.

According to the pixel structure in this embodiment, the light-reflecting surface provided by the stepped portion 160 of the second electrode 148 is located in the peripheral area of the second electrode 148. Owing to this, among the light emitted by the organic EL layer 162 in an area corresponding to the inner area of the second electrode 148, the oblique light component is reflected by the light-reflecting surface. This can further increase the light utilization factor.

Embodiment 4

Figure 7:
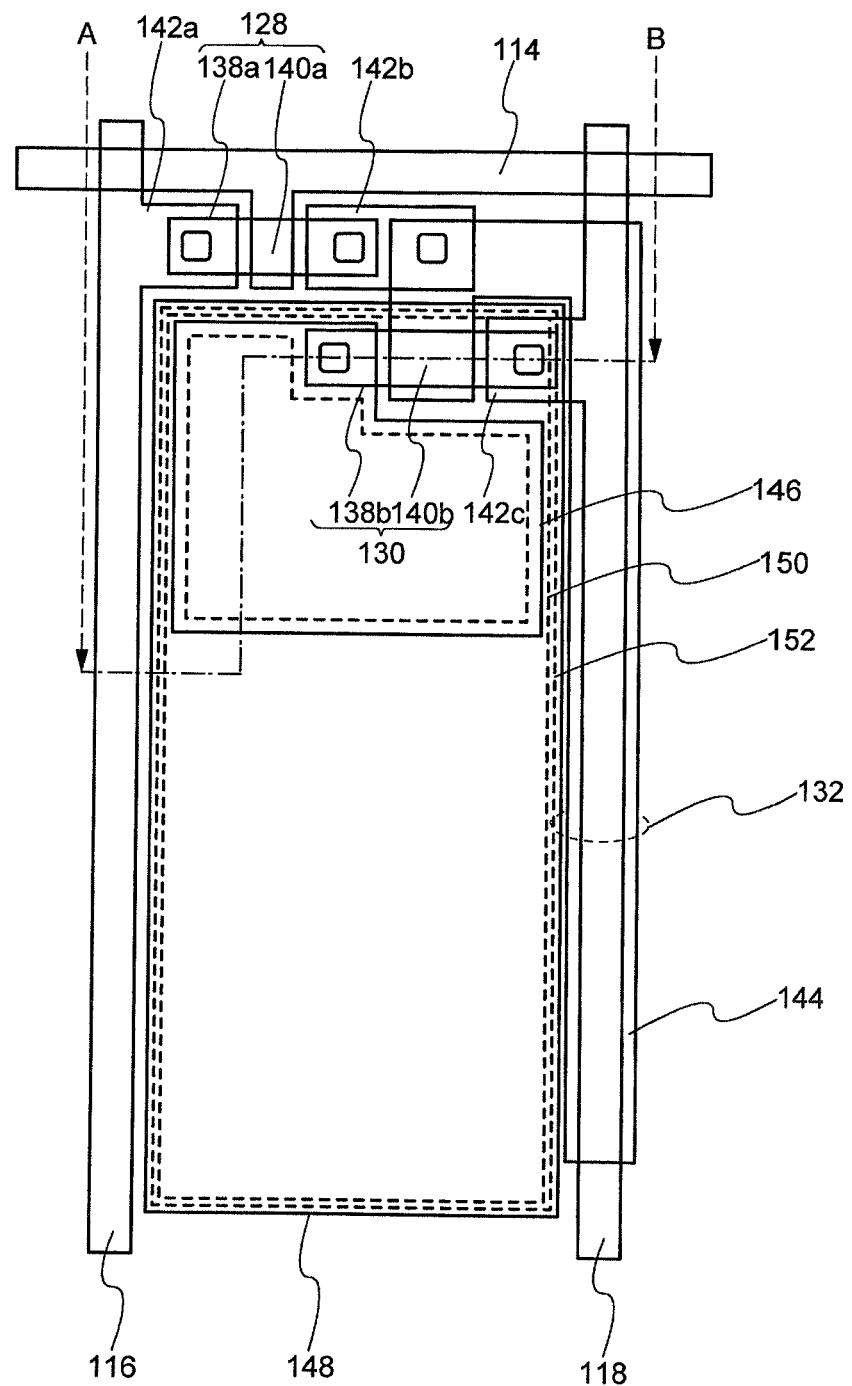
FIG. 7 is a plan view showing a pixel structure of an organic electroluminescent display device according to one embodiment of the present invention.
Figure 8:
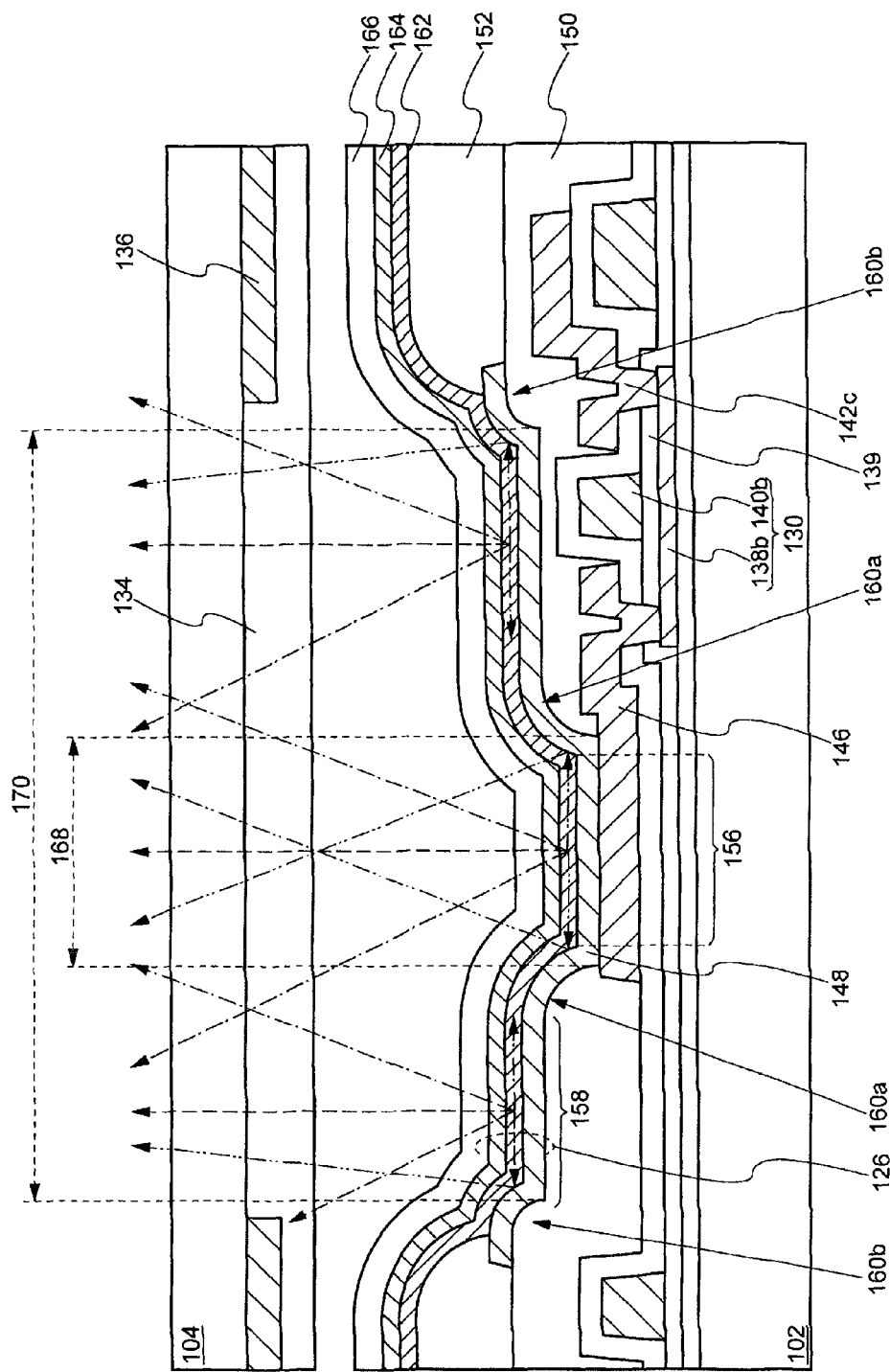
FIG. 8 is a cross-sectional view showing the pixel structure of the organic electroluminescent display device according to one embodiment of the present invention.

With reference to FIG. 7 and FIG. 8, a pixel structure of an organic electroluminescent display device in this embodiment will be described. FIG. 7 is a plan view of a pixel, and FIG. 8 shows a cross-sectional structure of the pixel taken along line A-B in FIG. 7. The following description will be given with reference to FIG. 7 and FIG. 8.

The first insulating layer 150 has a first opening 168 that exposes the top surface of the first electrode 146. An edge portion of the first insulating layer 150 around the first opening 168 is provided so as to cover a peripheral portion of the first electrode 146. A side wall of the first opening 168 includes an inclining surface. Preferably, as schematically shown in FIG. 8, the inclining surface may have a continuously changing inclination angle like a quadratic curve as seen in a cross-sectional view.

Embodiment 3 is different from Embodiment 1 in the height of the side wall of the first opening 168. In FIG. 8, the first insulating layer 150 is thinner than that in FIG. 3, and thus a first stepped portion 160a is lower than the stepped portion 160 in FIG. 3. As can be seen, since the first insulating layer 150 is thinned in the vicinity of the first electrode 146, and thus the first stepped portion 160a formed by the first opening 168 is inclining more gently.

The first insulating layer 150 has a second opening 170 outer to the first opening 168. It is preferable that an edge portion of the second opening 170 of the first insulating layer 150 is provided along a peripheral area of the second electrode 148. It is preferable that a side wall of the second opening 170 also includes an inclining surface. A peripheral portion of the second electrode 148 is provided along the inclining surface and thus a second stepped portion 160b is formed.

The peripheral portion of the second electrode 148 is covered with the second insulating layer 152. The organic EL layer 162 and the third electrode 164 are provided over the second electrode 148 and onto the surface of the second insulating layer 152. As can be seen, the pixel in this embodiment includes the first stepped portion 160a in the inner area thereof and also the second stepped portion 160b in an area outer to the first stepped portion 160a.

As described above in Embodiment 1, the first stepped portion 160a (corresponding to the stepped portion 160 in Embodiment 1) of the second electrode 148 acts as a light-reflecting surface that reflects the parallel light component emitted by the organic EL layer 162 (light represented with the arrowed two-dot chain lines in FIG. 8) and the oblique light component also emitted by the organic EL layer 162 (light represented with the arrowed one-dot chain lines in FIG. 8) in a direction that the light is to be emitted from the pixel. In this embodiment, the first stepped portion 160a and the second stepped portion 160b both act as a light-reflecting surface. In addition, the inclination angle of the first stepped portion 160a and the inclination angle of the second stepped portion 160b are made different from each other. Therefore, a larger amount of the parallel light component and also a larger amount of the oblique light component are reflected, and the direction in which the light reflected by the first stepped portion 160a is emitted made different from the direction in which the light reflected by the second stepped portion 160b is emitted.

Figure 9:
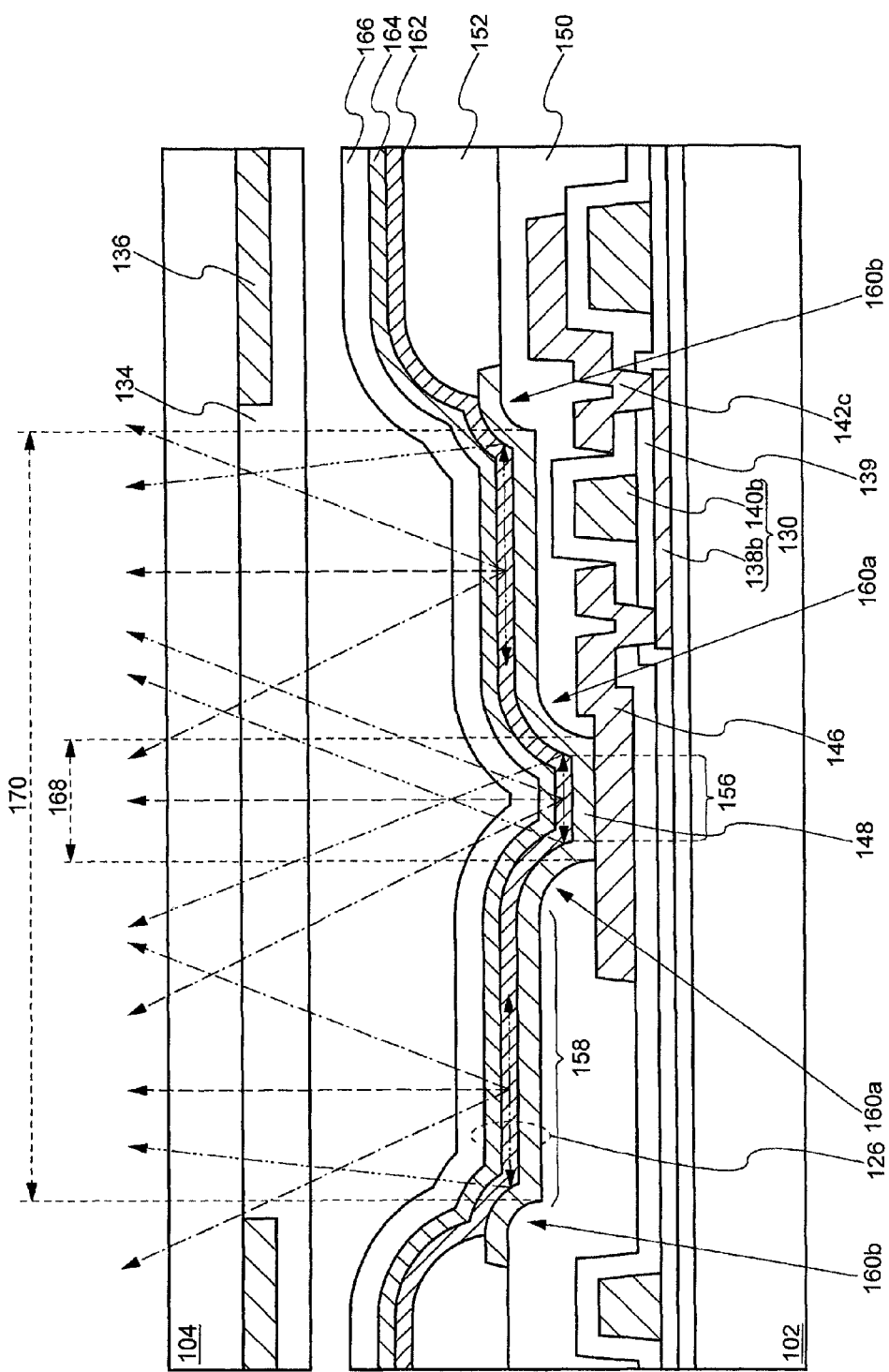
FIG. 9 is a cross-sectional view showing a pixel structure of an organic electroluminescent display device according to one embodiment of the present invention.

FIG. 9 shows a modification example of this embodiment. In the structure shown in FIG. 9, the first opening 168 of the first insulating layer 150 is smaller than that in FIG. 8. As can be seen, the second planar area 158 over the first insulating layer 150 is enlarged in this manner, and thus a larger amount of the parallel light component and also a larger amount of the oblique light component are reflected by the second stepped portion 160b. In addition, a connection area between the first electrode 146 and the second electrode 148, namely, the area of the contact hole also acts as a light emitting area. This can increase the numerical aperture of the pixel.

In this embodiment, the thickness of the first insulating layer 150 is made different in one area from in another area so as to provide the first stepped portion 160a and the second stepped portion 160b. The first insulating layer 150 having such different thicknesses can be formed by, for example, etching performed such that the first insulating layer 150 is partially thinner than the rest thereof. In this case, a half-tone mask may be used in a photolithography step to decrease the number of steps.

In the organic electroluminescent display device in this embodiment, a plurality of stepped portions are provided in the plane of the second electrode 148, namely, in the pixel. Owing to this structure, the light that is emitted parallel to the film surface of the organic electroluminescence layer 162 and the light that is emitted obliquely from the organic electroluminescence layer 162 are reflected in a larger number of areas to become emitted light from the pixel.

According to the pixel structure in this embodiment, a plurality of stepped portions are provided in the pixel. Owing to this structure, among the light emitted by the organic EL layer 162, the parallel light component and the oblique light component are reflected by the plurality of light-reflecting surfaces. This can further increase the light utilization factor.

Embodiment 5

Figure 10:
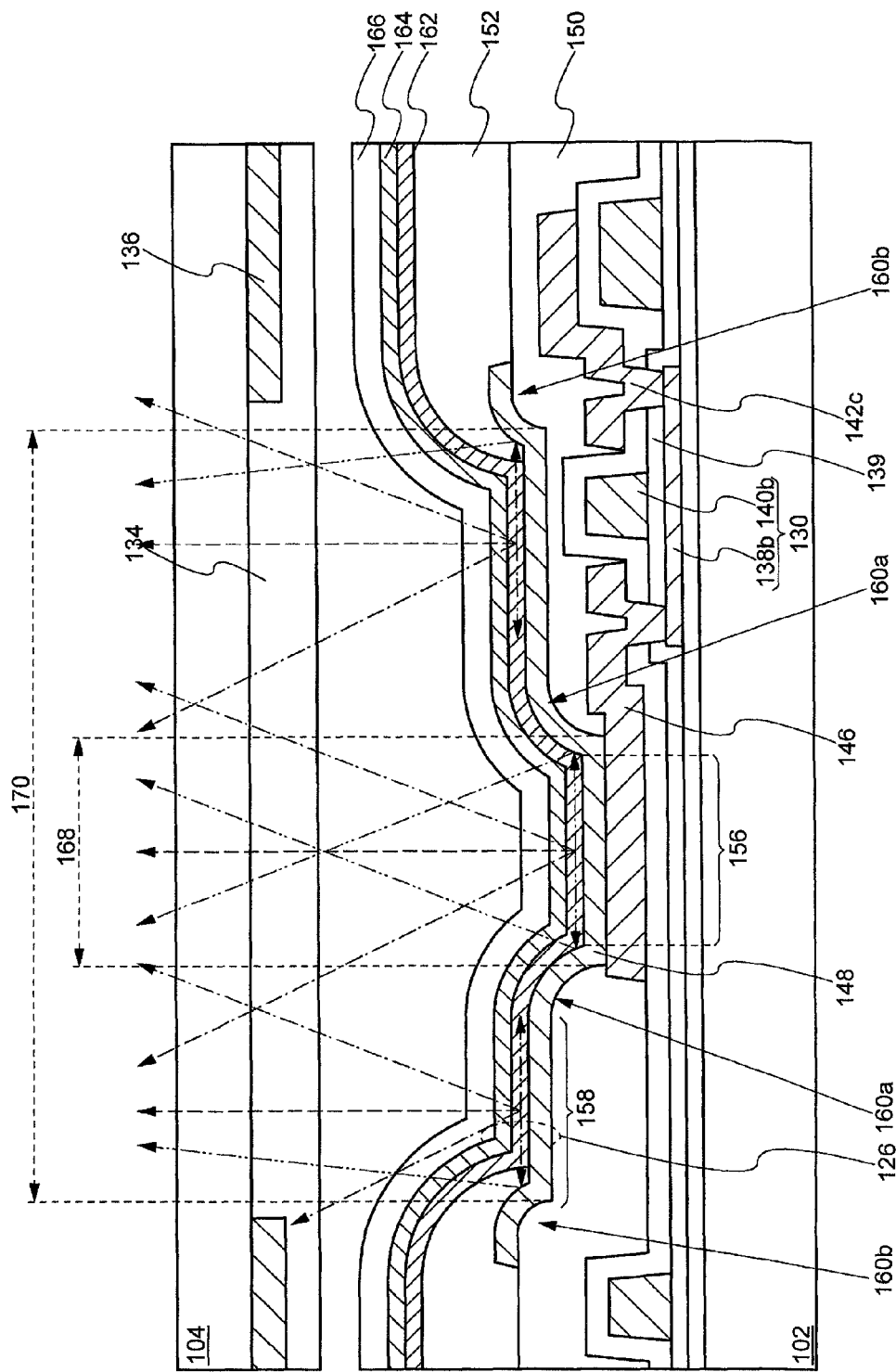
FIG. 10 is a cross-sectional view showing a pixel structure of an organic electroluminescent display device according to one embodiment of the present invention.

FIG. 10 shows a structure in which the second stepped portion 160b is buried by the second insulation layer 152. The organic EL layer 162 and the third electrode 164 are formed over the surface of the second electrode 148 and onto the surface of the second insulating layer 152. A light emitting area of the organic EL layer 162 is formed in an area where the second electrode 148 and the third electrode 164 overlap each other while having the organic EL layer 162 there between. Therefore, in this embodiment, the organic EL layer 162 does not emit light in an area corresponding to the inclining surface along the peripheral portion of the second electrode 148. Light is not emitted obliquely in this area.

In the meantime, the second stepped portion 160b of the second electrode 148 acts as a light-reflecting surface. Therefore, among the light emitted by the organic EL layer 162, the parallel light component (light represented with the arrowed two-dot chain lines in FIG. 10) and the oblique light component (light represented with the arrowed one-dot chain lines in FIG. 10) are reflected by the second stepped portion 160b to become emitted light from the pixel.

In the organic electroluminescent display device in this embodiment, a plurality of stepped portions are provided in the plane of the second electrode 148, namely, in the pixel, and the stepped portion 160b along the peripheral portion of the second electrode 148 is covered with the second insulating layer 152. Owing to this structure, the stepped portion 160b is a non-light emitting area and acts as a light-reflecting surface. Therefore, the light that is emitted parallel to the film surface of the organic electroluminescence layer 162 and the light that is emitted obliquely from the organic electroluminescence layer 162 are reflected by the light-reflecting surface to become emitted light from the pixel.

According to the pixel structure in this embodiment, the second insulating layer 152 is provided so as to cover the peripheral portion of the second electrode 148. Owing to this structure, the light emitting area is flat in an area inner to the peripheral portion of the second electrode 148, and the parallel light component and the oblique light component in the organic EL layer 162 are reflected. This can increase the light utilization factor.

What is claimed is:

1. An organic electroluminescent display device, comprising:
   a first electrode connecting to a light emitting control device;
   a first insulating layer covering a peripheral portion of the first electrode and having an opening exposing a central portion of the first electrode;
   a second electrode contacting the first electrode in the opening of the first insulating layer and extending from an upper surface of the first electrode to an upper surface of the first insulating layer;
   a second insulating layer covering a peripheral portion of the second electrode;
   an organic electroluminescence layer extending from a top surface of the second electrode to a top horizontal surface of the second insulating layer;
   a third electrode over the organic electroluminescence layer;
   the second electrode including a stepped portion between the first electrode and the first insulating layer; and
   a passivation layer over the third electrode,
   wherein a portion of the third electrode and the passivation layer are located in the opening of the first insulating layer, and
   an overlapping area of the second electrode, the organic electroluminescence layer and the third electrode is a light emitting area, and the light emitting area includes the stepped portion.

2. The organic electroluminescent display device according to claim 1, wherein the second electrode has a light-reflecting surface, and the light-reflecting surface is curved at the stepped portion.

3. The organic electroluminescent display device according to claim 2, wherein the second electrode includes a metal layer formed of aluminum (Al) or silver (Ag) and a transparent conductive layer provided over a top surface of the metal layer.

4. The organic electroluminescent display device according to claim 1, further comprising:
   a pixel area in which a plurality of a pixels are arrayed in a matrix; and
   a plurality of a gate signal lines and a plurality of a data signal lines provided in the pixel area, the gate signal lines and the data signal lines provided to intersect each other, and each of the plurality of the pixels surrounded by the plurality of the data signal lines and the plurality of the gate signal lines,
   wherein each of the plurality of the pixels includes the first electrode, the second electrode, the third electrode, the first insulating layer, second insulating layer, and the organic electroluminescence layer, and
   the first insulating layer, the second insulating layer, the organic electroluminescence layer and the third electrode are shared by the plurality of pixels.

* * * * *